United States Patent
Wang et al.

(10) Patent No.: US 10,636,890 B2
(45) Date of Patent: Apr. 28, 2020

(54) CHAMFERED REPLACEMENT GATE STRUCTURES

(71) Applicant: GLOBALFOUNDRIES INC., Grand Cayman (KY)

(72) Inventors: Haiting Wang, Clifton Park, NY (US); Rongtao Lu, Rexford, NY (US); Chih-Chiang Chang, Clifton park, NY (US); Guowei Xu, Ballston Lake, NY (US); Hui Zang, Guilderland, NY (US); Scott Beasor, Greenwich, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/974,282

(22) Filed: May 8, 2018

(65) Prior Publication Data
US 2019/0348517 A1    Nov. 14, 2019

(51) Int. Cl.
| H01L 29/49 | (2006.01) |
| H01L 29/40 | (2006.01) |
| H01L 29/78 | (2006.01) |
| H01L 29/423 | (2006.01) |
| H01L 21/768 | (2006.01) |

(52) U.S. Cl.
CPC ........ H01L 29/4983 (2013.01); H01L 29/401 (2013.01); H01L 29/42376 (2013.01); H01L 29/785 (2013.01); H01L 21/76897 (2013.01)

(58) Field of Classification Search
CPC ............. H01L 29/42376; H01L 29/785; H01L 29/401; H01L 21/76897
See application file for complete search history.

(56) References Cited

U.S. PATENT DOCUMENTS

| 9,129,986 B2 | 9/2015 | Zang et al. |
| 9,443,771 B1 | 9/2016 | Shen et al. |
| 2013/0187236 A1* | 7/2013 | Xie ................... H01L 29/4966 257/369 |
| 2015/0171086 A1 | 6/2015 | Cai et al. |
| 2016/0149015 A1* | 5/2016 | Cai ................... H01L 29/66545 257/401 |
| 2018/0108748 A1* | 4/2018 | Chen .................. H01L 29/4966 |

* cited by examiner

Primary Examiner — Jay C Chang
Assistant Examiner — Mikka Liu
(74) Attorney, Agent, or Firm — Francois Pagette; Andrew M. Calderon; Roberts Calderon Safran & Cole, P.C.

(57) ABSTRACT

The present disclosure relates to semiconductor structures and, more particularly, to chamfered replacement gate structures and methods of manufacture. The structure includes: a recessed gate dielectric material in a trench structure; a plurality of recessed workfunction materials within the trench structure on the recessed gate dielectric material; a plurality of additional workfunction materials within the trench structure and located above the recessed gate dielectric material and the plurality of recessed workfunction materials; a gate metal within the trench structure and over the plurality of additional workfunction materials, the gate metal and the plurality of additional workfunction materials having a planar surface below a top surface of the trench structure; and a capping material over the gate metal and the plurality of additional workfunction materials.

19 Claims, 4 Drawing Sheets

CHAMFERED REPLACEMENT GATE STRUCTURES

FIELD OF THE INVENTION

The present disclosure relates to semiconductor structures and, more particularly, to chamfered replacement gate structures and methods of manufacture.

BACKGROUND

Integrated circuit (IC) chips include a stack of several levels or sequentially formed layers of material to define active devices (e.g., FETs) and passive devices (wirings, etc.). For example, a FinFET would include a gate dielectric material and metal gate materials formed on a semiconductor material. The metal gate materials would be protected by a capping material, with sidewall spacers provided on the sides of the gate dielectric material and metal gate materials. Source and drain regions are formed in or on the semiconductor material on sides of the gate material.

As FinFETs continue to shrink in size (e.g., 22 nm and beyond), a work-function metal chamfering process is necessary to achieve a desired threshold voltage (Vth). However, the nominal gate conductor (PC) critical dimension (CD) is challenging for the chamfering process and subsequent metal fill process at these smaller technology nodes. And, as gate dimensions shrink, gate resistance increases and more low-resistance metal such as tungsten (W) is needed relative to higher resistance work-function metal (WFM) such as TiN. Moreover, at such technology nodes, the source and gate contact formation process may result in shorting to the gate material and/or to the gate dielectric material.

SUMMARY

In an aspect of the disclosure, a structure comprises: a recessed gate dielectric material in a trench structure; a plurality of recessed workfunction materials within the trench structure on the recessed gate dielectric material; a plurality of additional workfunction materials within the trench structure and located above the recessed gate dielectric material and the plurality of recessed workfunction materials; a gate metal within the trench structure and over the plurality of additional workfunction materials, the gate metal and the plurality of additional workfunction materials having a planar surface below a top surface of the trench structure; and a capping material over the gate metal and the plurality of additional workfunction materials.

In an aspect of the disclosure, a structure comprises: a trench structure; a sidewall material lining sidewalls of the trench structure; a dielectric material on a surface of the sidewall material, the dielectric material having a height below a top surface of the trench structure; a plurality of recessed workfunction gate materials provided over the dielectric material and having a height that is below the top surface of the trench structure; workfunction gate materials over the plurality of recessed workfunction gate materials, with a bottom of the workfunction gate materials contacting the sidewall material above the dielectric material; and a gate metal formed within a remaining portion of the trench structure and on a top portion of the workfunction gate materials.

In an aspect of the disclosure, a method comprises: forming a trench structure; forming a sidewall material lining sidewalls of the trench structure; forming a dielectric material on a surface of the sidewall material; recessing the dielectric material to a height below a top surface of the trench structure; forming a plurality of workfunction gate materials over the dielectric material; recessing the plurality of workfunction gate materials to a height that is below the top surface of the trench structure; forming workfunction gate materials over the plurality of recessed workfunction gate materials, with a bottom of the workfunction gate materials contacting the sidewall material above the dielectric material; and forming a gate metal within a remaining portion of the trench structure and on a top portion of the workfunction gate materials.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to chamfered gate structures and methods of manufacture. More specifically, the present disclosure provides a spacer chamfering for replacement metal gate technologies. Advantageously, the methods described herein provide improved device and process control. For example, the methods described herein result in a structure with improved metal gate fill loading control in a self-aligned contact (SAC) gate module. In addition, the methods described herein significantly reduce or eliminate gate to source/drain contact shorting in smaller technology nodes, e.g., 22 nm and beyond.

In embodiments, the gate structure comprises a trench structure in a dielectric layer, formed over a substrate. A recessed high-K gate dielectric material is located at the bottom of the trench. A workfunction metal is over the high-K gate dielectric material. A first metal layer (TiN) is over the workfunction metal and a second metal (W) is over the TiN layer. A cap is over the second metal. A top surface of the high-K gate dielectric is below a bottom surface of the second metal.

The chamfered gate structures of the present disclosure can be manufactured in a number of ways using a number of different tools. In general, though, the methodologies and tools are used to form structures with dimensions in the micrometer and nanometer scale. The methodologies, i.e., technologies, employed to manufacture the chamfered gate structures of the present disclosure have been adopted from integrated circuit (IC) technology. For example, the structures are built on wafers and are realized in films of material patterned by photolithographic processes on the top of a wafer. In particular, the fabrication of the chamfered gate structures uses three basic building blocks: (i) deposition of thin films of material on a substrate, (ii) applying a patterned mask on top of the films by photolithographic imaging, and (iii) etching the films selectively to the mask.

Figure 1:
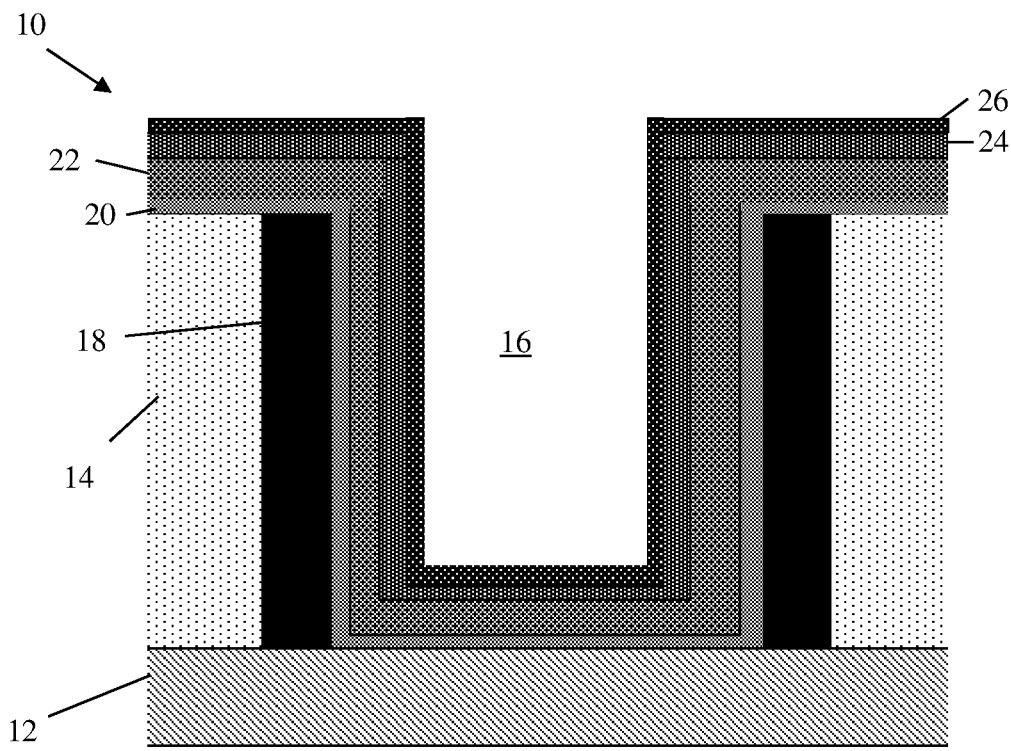
FIG. 1 shows gate dielectric material and workfunction metal(s) in a trench formed in dielectric material, amongst other features, and respective fabrication processes in accordance with aspects of the present disclosure.

FIG. 1 shows a starting structure with gate dielectric material and workfunction metals in a trench, amongst other features, and respective fabrication processes in accordance with aspects of the present disclosure. More specifically, the structure 10 includes a fin structure 12 composed of semiconductor material. In embodiments, the semiconductor material can be composed of any suitable material including, but not limited to, Si, SiGe, SiGeC, SiC, GaAs, InAs, InP, and other III/V or II/VI compound semiconductors. In further embodiments, the fin structure 12 can be composed from a silicon on insulator (SOI) wafer.

In embodiments, the fin structure 12 can be fabricated using conventional sidewall image techniques (SIT). In an example of a SIT technique, a mandrel material, e.g., $SiO_2$, is deposited on the semiconductor material using conventional chemical vapor deposition (CVD) processes. A resist formed on the mandrel material is exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures 12, for example. The mandrels are removed or stripped using a conventional etching process, selective to the mandrel material. An etching is then performed within the spacing of the spacers to form sub-lithographic features. The sidewall spacers can then be stripped.

Still referring to FIG. 1, after a conventional dummy gate formation process, a dielectric material 14 is deposited on the fin structure 12. The dielectric material 14 can be any interlevel dielectric material such as oxide deposited using a conventional deposition method, e.g., CVD, followed by a polishing process, e.g., chemical mechanical polishing (CMP).

More specifically, in embodiments, the dummy gate is formed on the fin structures 12 by a deposition of poly material, followed by a patterning process, e.g., conventional CMOS lithography and etching processes. A spacer material is then deposited on the sidewalls of the patterned poly material, which can be followed by a conventional anisotropic etching process to remove the spacer material on the substrate, e.g., fin structures 12. A trench 16 is formed in the dielectric material 14 by removal of the dummy gate material, e.g., poly material. In embodiments, sidewall spacers 18, which were deposited on the sidewalls of the patterned poly material, will now be sidewalls of the trench 16. In embodiments, the sidewall spacers 18 can be SiN material, as an example, deposited by any conventional deposition process, e.g., CVD processes.

FIG. 1 further shows a gate dielectric material 20 deposited in the trench 16, over the sidewall spacers 18 and the upper surface of the dielectric material 14. In embodiments, the gate dielectric material 20 can be a high-k dielectric material. For example, the gate dielectric material 20 can be $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate dielectric material 20 can be deposited by an atomic layer deposition (ALD) process to a thickness of about 1.5 nm, as an example; although other dimensions are also contemplated herein.

Multiple materials 22, 24, 26, e.g., workfunction materials, are deposited on the gate dielectric material 20 to different thicknesses depending on the desired device performances. In embodiments, the multiple materials 22, 24, 26 can be metal layers, e.g., a bottom cluster 22 of TiN material, a P-type workfunction metal 24 and TiN material 26; although other metals or amorphous materials (a-Si) are contemplated herein. The different materials 22, 24, 26 can be deposited by an ALD blanket deposition process to certain thicknesses depending on the initial width of the trench 16. For example, the combination of the materials 22, 24 and 26 can have a thickness of about 10 nm.

Figure 2:
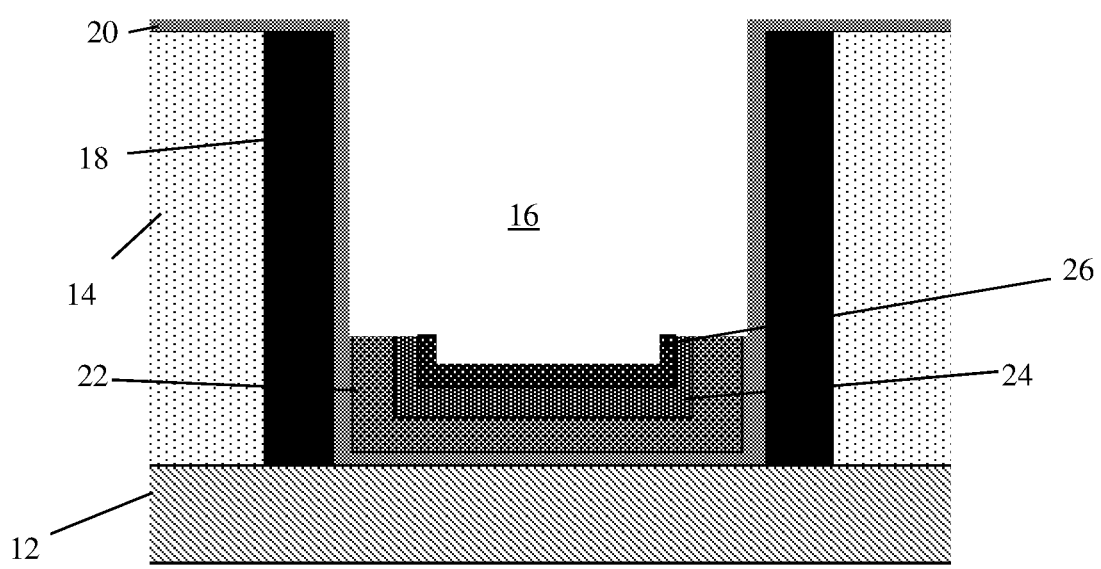
FIG. 2 shows chamfered (recessed) workfunction metal(s), amongst other features, and respective fabrication processes in accordance with aspects of the present disclosure.

In FIG. 2, the materials 22, 24, 26 are recessed within the trench 16 using a selective etch chemistry that will not attack the gate dielectric material 20. In this way, only the materials 22, 24, 26 will be recessed, leaving the gate dielectric material 20 on the sidewalls of the trench 16. In embodiments, the materials 22, 24, 26 can be recessed to about 10 nm above the surface of the fin structure 12; although other dimensions are also contemplated herein depending on the device performance requirements.

Figure 3:
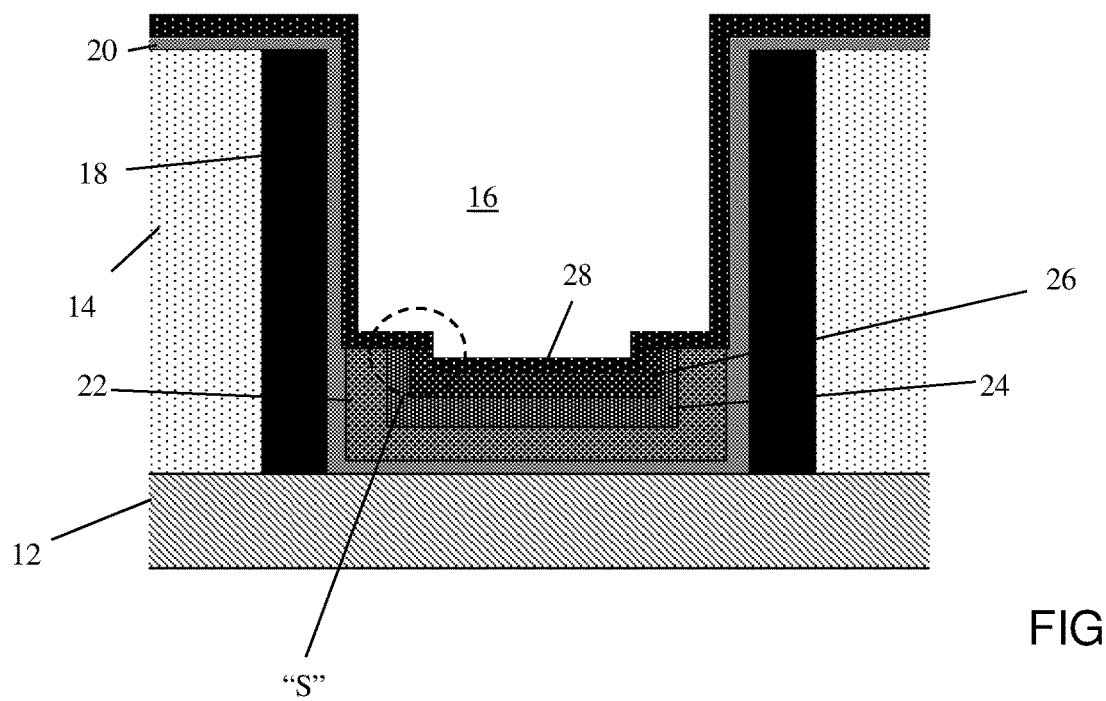
FIG. 3 shows material over the chamfered workfunction metal(s), amongst other features, and respective fabrication processes in accordance with aspects of the present disclosure.

As shown in FIG. 3, a bottom cluster of metal 28 is deposited on the recessed materials 22, 24, 26 and the gate dielectric material 20. The deposition of the bottom cluster of metal 28 on the recessed materials 22, 24, 26 will result in a single stepped configuration (as shown in the circle labeled "S"). In embodiments, the metal 28 can be, e.g., TiN. The metal 28 can be deposited by a conventional blanket deposition process, e.g., CVD.

Figure 4:
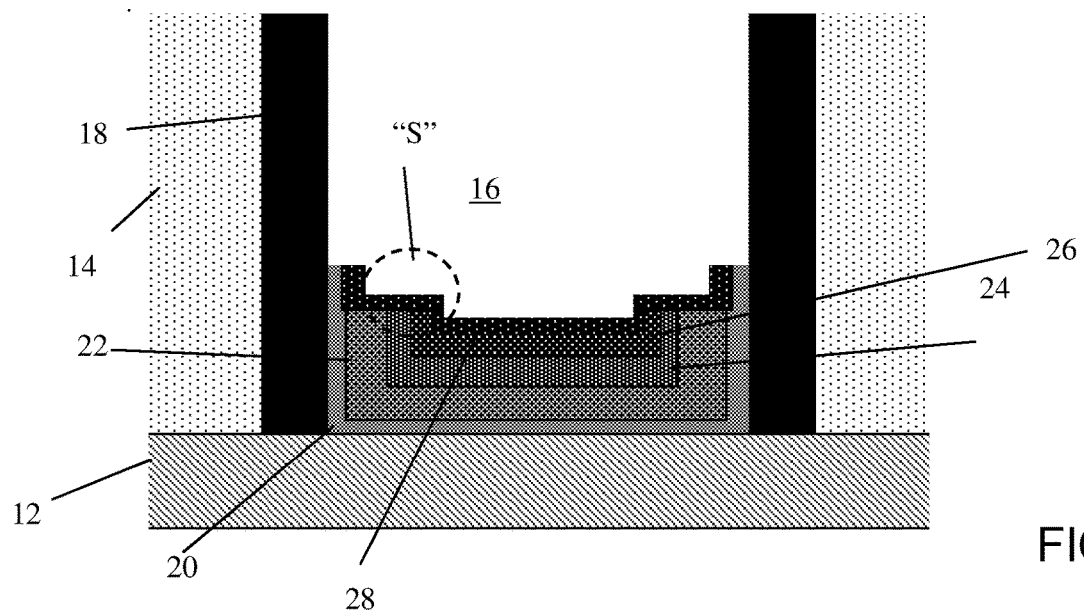
FIG. 4 shows chamfered (recessed) gate dielectric material, amongst other features, and respective fabrication processes in accordance with aspects of the present disclosure.

In FIG. 4, the metal 28 and the gate dielectric material 20 are recessed (chamfered) from the sidewalls of the trench 16. As shown, the recessed metal 28 and the gate dielectric material 20 are at a same height above the recessed materials 22, 24, 26. This recessing will ensure that there is adequate space in the trench 16 for subsequent metal material fill, e.g., workfunction materials and tungsten metal, for a self-aligned contact replacement gate structure. In embodiments, the metal 28 and the gate dielectric material 20 can be removed using conventional lithography and etching processes. For example, a mask/resist deposited over the structure will be patterned to expose the metal 28 and the gate dielectric material 20, while protecting the sidewall spacers 18 and dielectric material 14. The exposed metal 28 and gate dielectric material 20 are then subjected to an etching process with a selective chemistry to partially remove such materials to a predetermined depth within the trench 16. The mask/resist is then removed using conventional stripant processes.

Figure 5:
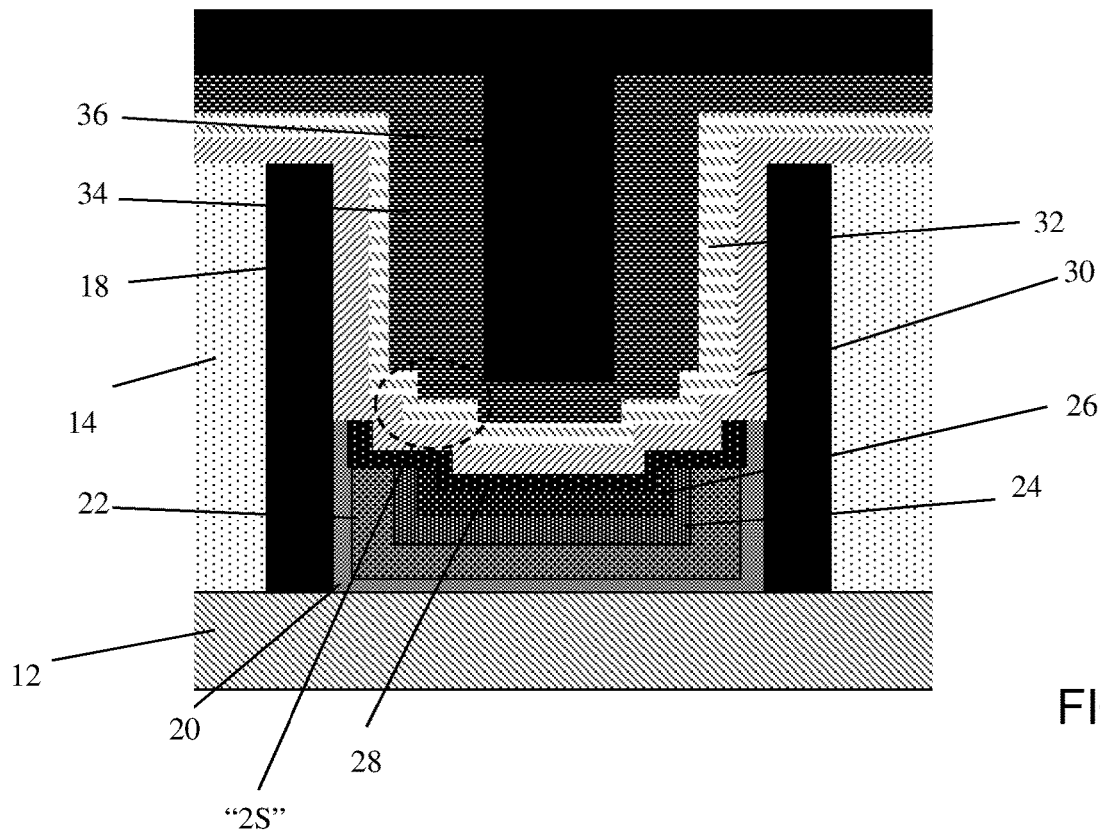
FIG. 5 shows gate materials over the recessed gate dielectric material, amongst other features, and respective fabrication processes in accordance with aspects of the present disclosure.

In FIG. 5, gate material 30, e.g., a workfunction metal, is deposited on the workfunction metal 28 and the sidewall spacers 18. In addition, the gate material 30 will cover the gate dielectric material 20. In this way, the gate dielectric material 20 is now completely covered, e.g., protected, during subsequent processing steps. In embodiments, the gate material 30, e.g., a workfunction metal, is a N-type workfunction metal, e.g., TiAlC.

A top cluster of metal material 32 is deposited on the workfunction metal 30 and a barrier metal 34 is deposited on the top cluster metal material 32. In embodiments, the top cluster of metal material 32 can be one or more layers of TiN, as an example. The barrier metal 34 can also be, e.g., TiN; although other barrier metals are contemplated herein. The deposition of the materials 32, 34, 26 on the recessed materials 22, 24, 26, 28 will result in a double stepped configuration (as shown in the circle labeled "2S").

Due to the recessing of materials in the trench, it is possible to leave enough space for the deposition of gate metal material 36. For example, the remaining portion of the trench 16 can have a width of about 4 nm, filled with the gate metal material 36. In this way, it is now possible to have improved fill loading control in a self-aligned contact (SAC) gate module for smaller technology nodes, e.g., 22 nm and beyond. In embodiments, the gate metal material 36 is tungsten (W).

Figure 6:
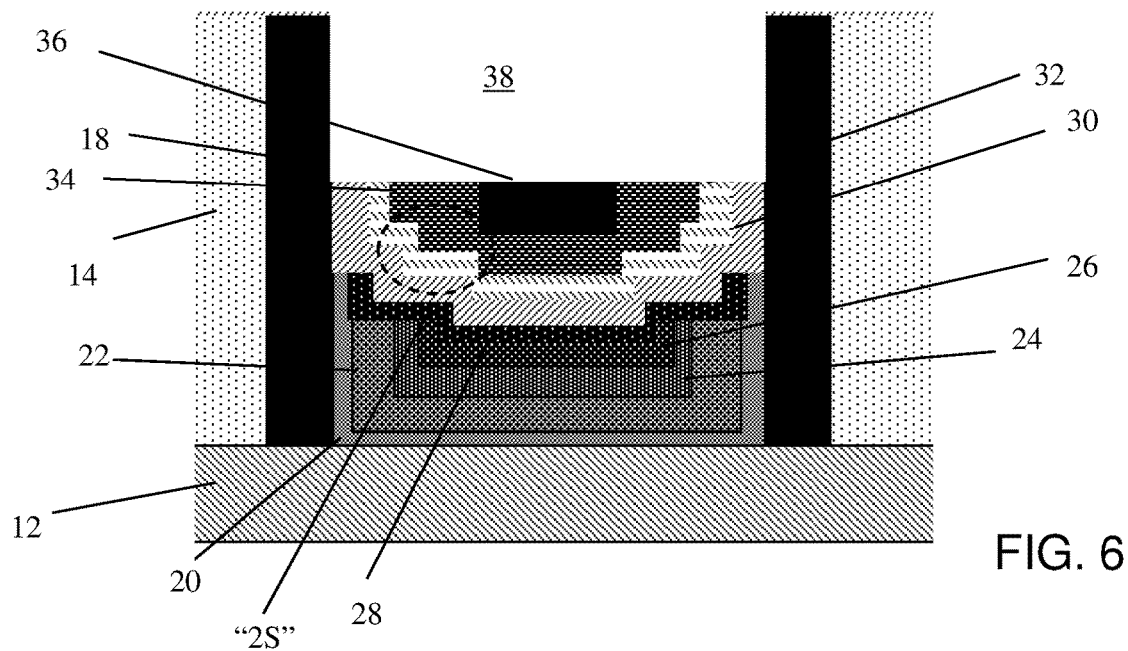
FIG. 6 shows recessed gate materials, amongst other features, and respective fabrication processes in accordance with aspects of the present disclosure.

Referring to FIG. 6, the workfunction metal 30, top cluster of metal material 32, barrier metal 34, and gate metal material 36 are planarized using a conventional CMP process. Following the planarization process, the materials 30, 32, 34 and 36 are recessed as represented by reference numeral 38. In this way, the workfunction metal 30, top cluster of metal material 32, barrier metal 34, and gate metal material 36 will form a recessed, single planar surface. In embodiments, the materials 30, 32, 34 and 36 can be recessed using a maskless process with a highly selective etch chemistry to the materials 30, 32, 34 and 36. In this way, metal materials 30, 32, 34 and 36 are recessed to below a surface of the sidewall spacers 18 (forming recess 38). In embodiments, the materials 30, 32, 34 and 36 can be recessed to a depth of about 15 nm to about 25 nm. This recessing process will lower the height of the metal materials 30, 32, 34 and 36, ensuring that source/drain contact metal will not short to the gate material, itself.

Figure 7:
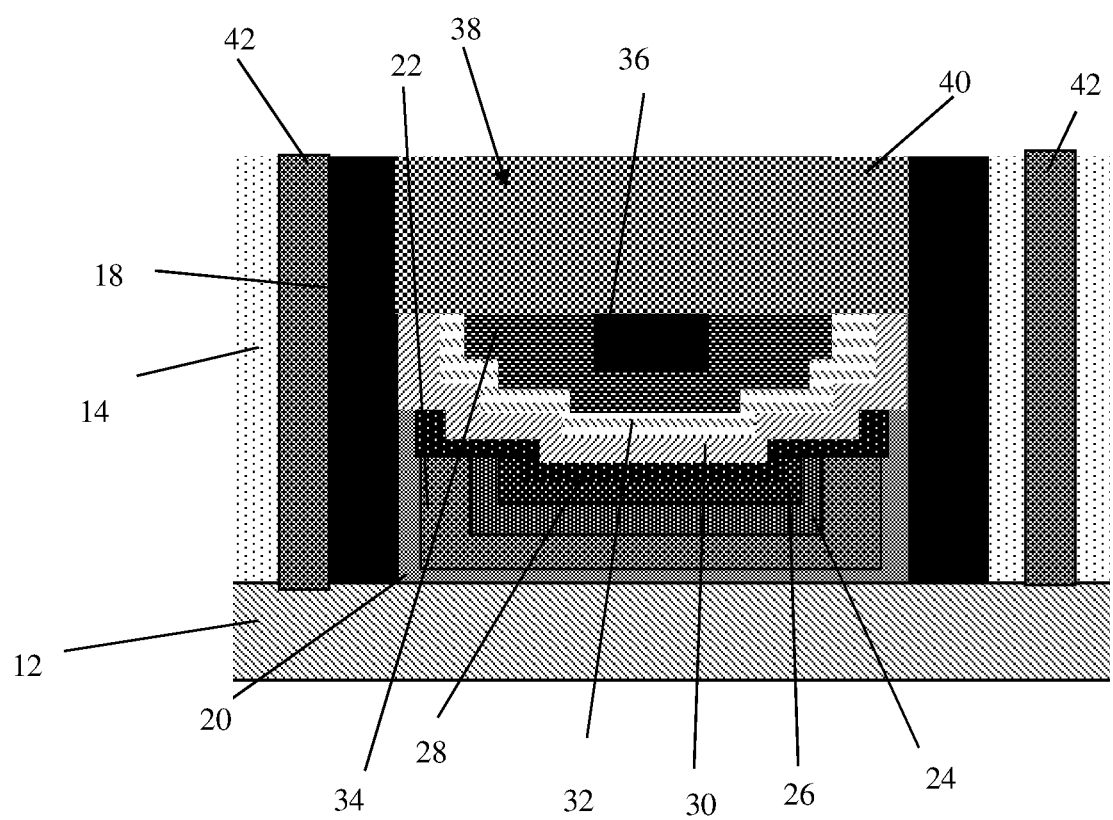
FIG. 7 shows a capping material on the recessed gate materials, amongst other features, and respective fabrication processes in accordance with aspects of the present disclosure.

FIG. 7 shows a capping material 40 deposited within the recess 38. In embodiments, the capping material 40 is SiN material deposited using a conventional CVD process. The SiN material can be planarized by a CMP process. In embodiments, the capping material 40 will protect the underlying materials 30, 32, 34 and 36 (with the 30, 32, 34 and 36 also protecting the gate dielectric material 20) during source/drain contact formation.

Following the CMP process, source/drain contacts 42 are formed in the dielectric material 14, on sides of the sidewall spacers 18. The source/drain contacts 42 can be formed by conventional contact formation processes, e.g., lithography, etching and deposition of metal material in trenches formed by the etching process. Advantageously, the recessed gate materials, e.g., metal materials and gate dielectric material, will not become exposed during the formation of the source/drain contacts 42, eliminating any shorts between the source/drain contacts 42 and the gate materials, and particularly any shorts forming to the gate dielectric material 20 (which is now recessed well below the surface of the dielectric material 14).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a recessed gate dielectric material in a trench structure;
   a plurality of recessed workfunction materials within the trench structure on the recessed gate dielectric material;
   a plurality of additional workfunction materials within the trench structure and located above the recessed gate dielectric material and the plurality of recessed workfunction materials;
   a gate metal within the trench structure and over the plurality of additional workfunction materials, the gate metal and the plurality of additional workfunction materials having a planar surface below a top surface of the trench structure;
   a capping material over the gate metal and the plurality of additional workfunction materials; and
   a metal material between the plurality of additional workfunction materials and the plurality of recessed workfunction materials,
   wherein the metal material includes a stepped feature transitioning within the plurality of recessed workfunction materials.

2. The structure of claim 1, wherein a top layer of the plurality of additional workfunction materials is TiN.

3. The structure of claim 1, wherein the metal material and the recessed gate dielectric material have a same height along a sidewall of the trench structure.

4. The structure of claim 1, wherein the plurality of additional workfunction materials includes a double stepped feature.

5. The structure of claim 1, wherein the plurality of additional workfunction materials has a lower layer in direct contact with the recessed gate dielectric material and sidewall material along the sidewall of the trench structure.

6. The structure of claim 5, wherein the recessed gate dielectric material directly contacts the sidewall material, below the plurality of additional workfunction materials.

7. The structure of claim 5, wherein the sidewall material is SiN.

8. The structure of claim 1, wherein the plurality of additional workfunction materials includes three layers of material which have a stepped feature.

9. The structure of claim 1, wherein the gate metal is tungsten.

10. The structure of claim 1, further comprising sidewall material completely lining and directly contacting sidewalls of the trench, wherein:
- the recessed dielectric material is directly contacting a lower portion of the sidewall material;
- a bottommost workfunction material of the plurality of recessed workfunction materials is directly contacting the recessed dielectric material, below a top surface of the recessed dielectric material;
- the plurality of recessed workfunction materials have planar upper surfaces with one another;
- a metal material has a stepped feature and is in direct contact with a topmost workfunction material of the plurality of recessed workfunction materials; and
- the plurality of additional workfunction materials have a double stepped feature, with a bottommost of the additional workfunction materials directly contacting the recessed dielectric material and the sidewall material.

11. A structure, comprising
- a trench structure;
- a sidewall material directly contacting and lining sidewalls of the trench structure;
- a dielectric material directly on a side surface of the sidewall material, the dielectric material having a height below a top surface of the trench structure;
- a plurality of recessed workfunction gate materials provided over the dielectric material and having a height that is below the top surface of the trench structure;
- workfunction gate materials over the plurality of recessed workfunction gate materials, with a bottom of the workfunction gate materials directly contacting the sidewall material above the dielectric material and directly contacting an upper portion of the dielectric material;
- a gate metal formed over the workfunction gate materials; and
- a capping material within a remaining portion of the trench structure and on a top portion of the workfunction gate materials.

12. The structure of claim 11, wherein the plurality of recessed workfunction gate materials has a height below the dielectric material.

13. The structure of claim 11, further comprising a bottom cluster of material on the plurality of recessed workfunction gate materials.

14. The structure of claim 13, wherein the bottom cluster of material contacts the dielectric material.

15. The structure of claim 14, wherein the bottom cluster of material has a height equal to the height of the dielectric material within the trench.

16. The structure of claim 15, wherein the gate metal formed and each layer of the workfunction gate materials are recessed to below the top surface of the trench structure, and a capping layer is provided on the gate metal formed and each layer of the workfunction gate materials.

17. The structure of claim 16, wherein a surface of the gate metal and each layer of the workfunction gate materials form a single planar surface, the sidewall material completely lines the sidewall of the trench structure, and the capping material is planar with the sidewall material and directly contacts each layer of the workfunction gate materials and the gate metal.

18. The structure of claim 14, wherein the bottom cluster of material comprises TiN.

19. A method comprising:
- forming a trench structure;
- forming a sidewall material directly contacting and lining sidewalls of the trench structure;
- forming a dielectric material directly on a side surface of the sidewall material;
- recessing the dielectric material to a height below a top surface of the trench structure;
- forming a plurality of workfunction gate materials over the dielectric material;
- recessing the plurality of workfunction gate materials to a height that is below the top surface of the trench structure;
- forming workfunction gate materials over the plurality of recessed workfunction gate materials, with a bottom of the workfunction gate materials directly contacting the sidewall material above the dielectric material and directly contacting an upper portion of the dielectric material; and
- forming a gate metal over the workfunction gate materials; and
- forming a capping material within a remaining portion of the trench structure and on a top portion of the workfunction gate materials.

\* \* \* \* \*